United States Patent

Son

[11] Patent Number: 6,064,096
[45] Date of Patent: May 16, 2000

[54] SEMICONDUCTOR LDD DEVICE HAVING HALO IMPURITY REGIONS

[75] Inventor: Jeong-Hwan Son, Daejon, Rep. of Korea

[73] Assignee: LG Semicon Co., Ltd., Cheongju, Rep. of Korea

[21] Appl. No.: 09/162,766

[22] Filed: Sep. 30, 1998

Related U.S. Application Data

[62] Division of application No. 08/979,565, Nov. 26, 1997, Pat. No. 5,851,866.

[30] Foreign Application Priority Data

Nov. 27, 1996 [KR] Rep. of Korea .................. 58081/1996

[51] Int. Cl.[7] .................................................. H01L 21/00
[52] U.S. Cl. ......................... 257/368; 257/344; 257/345; 257/346; 257/369; 257/408; 257/607; 257/655
[58] Field of Search ..................................... 257/345, 368, 257/344, 346, 369, 408, 607, 655

[56] References Cited

U.S. PATENT DOCUMENTS

| | | |
|---|---|---|
| 5,208,472 | 5/1993 | Su et al. . |
| 5,212,542 | 5/1993 | Okumura . |
| 5,296,401 | 3/1994 | Mitsui et al. . |
| 5,434,440 | 7/1995 | Yoshitomi et al. . |
| 5,504,024 | 4/1996 | Hsu . |
| 5,563,093 | 10/1996 | Koda et al. . |
| 5,571,735 | 11/1996 | Mogami et al. . |
| 5,591,650 | 1/1997 | Hsu et al. . |
| 5,599,734 | 2/1997 | Byun et al. . |
| 5,770,490 | 6/1998 | Frenette et al. . |
| 5,827,747 | 10/1998 | Wang et al. ............................. 257/344 |
| 5,885,886 | 3/1999 | Lee ......................................... 437/247 |

*Primary Examiner*—Fetsum Abraham

[57] ABSTRACT

A semiconductor device and fabrication method therefor which improve device operation of a CMOS device. The semiconductor device and fabrication method therefor prevent the deterioration of short channel properties of a PMOS device and improve current driving capability of an NMOS device. The semiconductor device has halo impurity regions formed in either the NMOS region or the PMOS region such that a channel length of the PMOS device. Also, the source and drain regions of the PMOS device are prevented from forming deep source and drain regions, thus, preventing deterioration of the short channel properties for the PMOS device.

20 Claims, 5 Drawing Sheets

SEMICONDUCTOR LDD DEVICE HAVING HALO IMPURITY REGIONS

This application is a divisional of application Ser. No. 08/979,565, filed on Nov. 26, 1997, U.S. Pat. No. 5,851,866, the entire contents of which are hereby incorporated by reference.

BACKGROUND OF THE INVENTION

1. Field of the Invention

The present invention relates to a semiconductor device, and its fabrication method, and more particularly, to a semiconductor device, and its fabrication method, having an improved operating performance.

2. Description of the Prior Art

With reference to FIG. 1, a brief description of a conventional CMOS device is as follows.

The conventional CMOS device includes a semiconductor substrate 11 having an N-type metal oxide NMOS region and a P-type metal oxide PMOS region. A field region 12 is formed between the NMOS region and the PMOS region. The field region 12 separates and distinguishes the NMOS region from the PMOS region.

An NMOS device and a PMOS device are also formed on the NMOS and PMOS regions, respectively. The NMOS and PMOS devices include an NMOS gate structure 100a and a PMOS gate structure 100b, respectively. The NMOS and PMOS gate structures 100a and 100b include gate insulating film 13 formed on a portion of the NMOS and PMOS regions, respectively, gate electrodes 14 formed on the gate insulating film 13, and a gate cap insulating film 20 formed on the gate electrodes 14. The NMOS and PMOS gate structures 100a and 100b also include sidewalls 19 formed on each side of the gate insulating film 13, the gate electrodes 14, and the gate cap insulating film 20.

In the NMOS region on each side of the NMOS gate structure 100a are formed $n^+$ source and drain (S/D) regions 16 (high density N-type impurity source and drain regions). Adjacent to each of the $n^-$ S/D regions 16 and under the NMOS gate structure 100a are formed $n^-$ low density (LD) regions 15 (low density N-type impurity regions). In addition, in the PMOS region on each side of the PMOS gate structure 100b are formed $p^-$ source and drain (S/D) regions 18 (high density P-type impurity source and drain regions), and $p^-$ low density (LD) regions 17 (low density P-type impurity regions) are formed adjacent to each of the $p^-$ S/D regions 18 under the gate structure 100b.

The conventional CMOS device, as described above, has the following problems. It is difficult to improve device performance when the sidewall length (i.e., the PMOS device are identical. The current driving capability can be improved for the NMOS device by decreasing the sidewall length of the sidewalls 19 for the NMOS device. Decreasing the sidewall length decreases a channel length between the $n^-$ LD regions 15 of the NMOS device and decreases the length of the channel between the p LD regions 17 for the PMOS device.

The decreased channel length improves the current driving capability for the NMOS device. However, because P-type impurity diffusion has a greater influence than N-type impurity diffusion, decreasing the sidewall length for the PMOS device causes the $p^-$ S/D regions 18 to increase in the vertical direction, i.e., to deepen, and to decrease the thickness of the and the $p^-$ LD regions 17. As a result, decreasing the sidewall length of the sidewalls 19 for the PMOS device deteriorates the short channel property for the PMOS device.

SUMMARY OF THE INVENTION

Accordingly, the present invention is directed to a semiconductor device and its fabrication method that substantially obviate one or more of the problems due to limitations and disadvantages of the conventional art.

An object of the present invention is to provide a semiconductor device and its fabrication methods that improve the operating performance of a CMOS device.

Another object of the present invention is to provide a semiconductor device and its fabrication method that improve current driving capability for a NMOS device while preventing short channel properties for a PMOS device from deteriorating.

Still another object of the present invention is to provide a semiconductor device and its fabrication method that decrease a channel length for a NMOS device.

A further object of the present invention is to provide a semiconductor device and its fabricating method that prevent high and low density P-type impurity regions for a PMOS device from deepening.

Another object of the present invention is to provide a semiconductor device and its fabrication method that form halo impurity regions without requiring an ion-implanting process.

To achieve these and other objects and in accordance with the purpose of the present invention, as embodied and broadly described, there is provided a method of fabricating a semiconductor device, the method includes the steps of: providing a substrate having a first region and a second region and a first gate structure and a second gate structure formed on the first region and the second region, respectively; forming first impurity regions in the first region on each side of the first gate structure; forming second impurity regions in the second region on each side of the second gate structure; forming first sidewalls on each side of the first gate structure and on each side of the second gate structure; forming third impurity regions in the second region on each side of the second gate structure from at least a portion of each of the second impurity regions; and forming fourth impurity regions adjacent to each of the first impurity regions in the first region and halo impurity regions adjacent to each of the second impurity regions in the second region.

These objects of the present invention are further achieved by providing a method of fabricating a semiconductor device, the method includes the steps of: providing a substrate having a first region and a second region and a first gate structure and a second gate structure formed on the first region and the second region, respectively; forming first impurity regions in the first region on each side of the first gate structure; forming first sidewalls on each side of the first gate structure and on each side of the second gate structure; forming second impurity regions in the first region on each side of the first sidewalls of the first gate structure from at least a portion of each of the first impurity regions; forming second sidewalls on sides of the first sidewalls; forming third impurity regions in the second region on each side of the second sidewalls of the second gate structure; forming fourth impurity regions adjacent to each of the third impurity regions in the second region and halo impurity regions adjacent to each of the first impurity regions in the first region.

These objects are still further achieved by providing a method of fabricating a semiconductor device, the method includes the steps of: providing a substrate having a NMOS region and a PMOS region; forming an NMOS gate structure and a PMOS gate structure on the NMOS region and the PMOS regions, respectively; forming an NMOS channel by forming N-type impurity regions in the NMOS region of the substrate on either side of the NMOS gate structure; forming a PMOS channel by forming P-type impurity regions in the PMOS region of the substrate on either side of the PMOS gate structure, the PMOS channel having a length which is greater than a length of the NMOS channel.

These objects are further achieved by providing a semiconductor device which includes: a substrate having a first region and a second region; a first gate structure and a second gate structure formed on the first region and the second region, respectively; first impurity regions formed in the first region on each side of the first gate structure; second impurity regions formed in the first region adjacent to each of the first impurity regions; third impurity regions formed in the second region on each side of the second gate structure; fourth impurity regions formed adjacent to each of the third impurity regions; and halo impurity regions formed adjacent to each of one of the second impurity regions and the fourth impurity regions.

These objects are still further achieved by providing a semiconductor device which includes: a substrate having an NMOS region and a PMOS region; an NMOS structure and a PMOS structure formed on the NMOS region and the PMOS region, respectively; N-type impurity regions formed on each side of the NMOS structure in the NMOS region; P-type impurity regions formed on each side of the PMOS structure in the PMOS region; a first channel formed between the N-type impurity regions under the NMOS structure; a second channel formed between the P-type impurity regions under the PMOS structure, the second channel having a length which is greater than a length of the first channel.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Reference will now be made in detail to the preferred embodiments of the present invention, examples of which are illustrated in the accompanying drawings.

Figure 1:
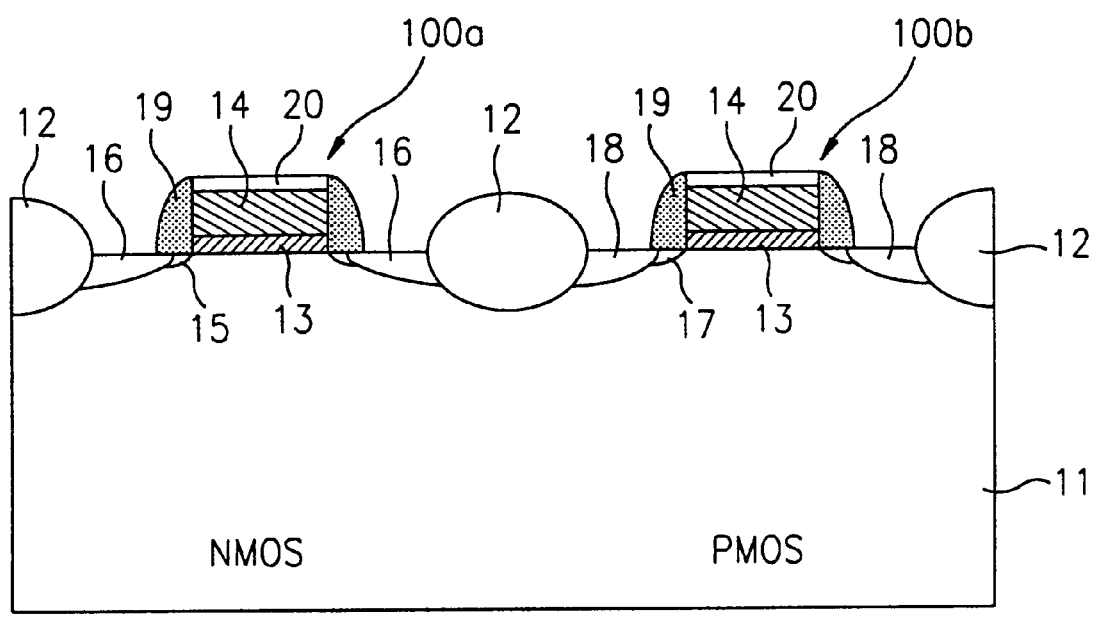
FIG. 1 is a cross-sectional view of a conventional CMOS device.
Figure 2A:
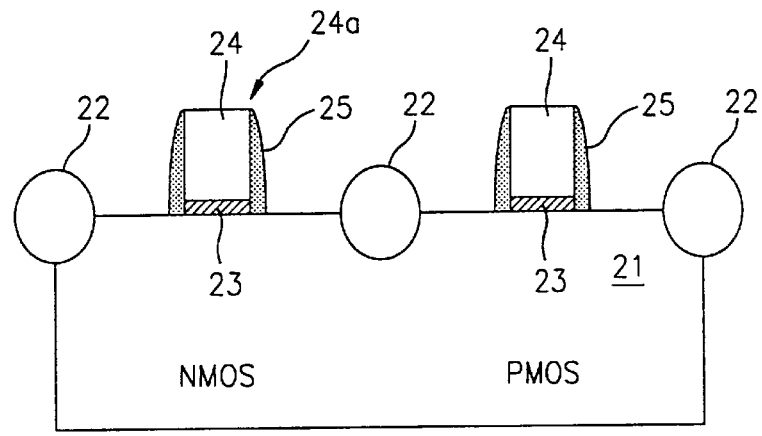
FIGS. 2A–2F are cross-sectional views illustrating the method of fabricating the semiconductor device according to a first embodiment of the present invention.

As shown in FIG. 2A, a semiconductor substrate 21 having a NMOS region and a PMOS region is provided.

Also provided is a field region 22 formed between the NMOS region and the PMOS region. The field region 22 separates and distinguishes the NMOS region from the PMOS region.

An NMOS device and a PMOS device are then formed on portions of the NMOS region and the PMOS region, respectively. The NMOS device includes an NMOS gate structure 24a and the PMOS device includes a PMOS gate structure 24b. The NMOS and PMOS gate structures 24a and 24b are formed by forming a gate insulating film 23, which is an oxide film, on portions of the NMOS and PMOS regions, respectively. A polysilicon layer is then deposited over the semiconductor substrate 21, and selectively removed using a photolithographic process to form a gate electrode layer 24 on the gate insulating film 23. A phosphorus silicate glass PSG film is then deposited over the semiconductor substrate 21 to a thickness, preferably, ranging from 300 Å to 700 Å. Using an etching process to selectively remove portions of the deposited PSG film, first sidewalls 25 are formed on each side of the gate insulating film 23 and the gate electrode layer 24.

Figure 2B:
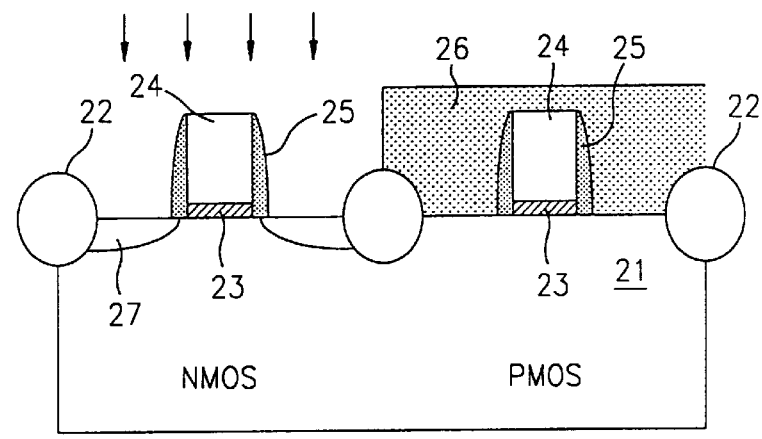

Referring to FIG. 2B, a first photoresist film 26 is formed over the PMOS region of the semiconductor substrate 21. As a result, the NMOS gate structure 24a and the upper surface of the NMOS region on each side of the NMOS gate structure 24a are exposed. Preferably, ionized arsenic As (10–50 KeV, 1E15–5E15 $cm^{-2}$) is then implanted into the exposed NMOS region. The implanted ionized As forms $n^+$ source and drain (S/D) regions 27 (high density N-type impurity source and drain regions) on each side of the NMOS gate structure 24a with a portion thereof formed under the first sidewalls 25 of the NMOS gate structure 24a.

Figure 2C:
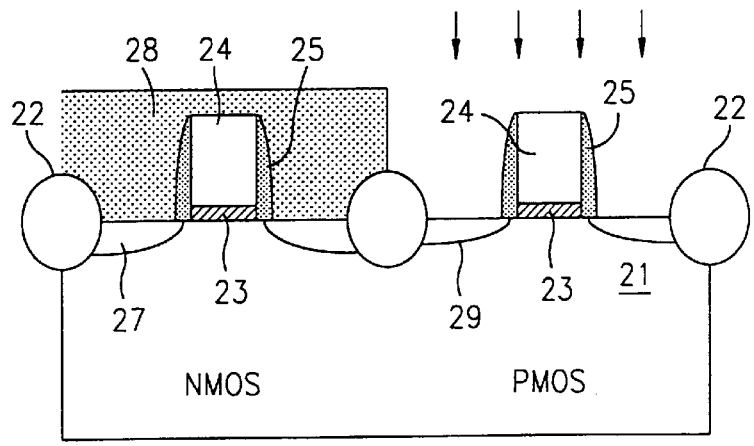

As shown in FIG. 2C, the first photoresist film 26 is removed, and a second photoresist film 28 is formed over the NMOS region of the semiconductor substrate 21. As a result, the PMOS gate structure 24b and the upper surface of the PMOS region on each side of the PMOS gate structure 24b are exposed. Preferably, ionized boron B (10–20 keV, 1E13–5E14 $cm^{-2}$) or ionized boron fluoride $BF_2$ (20–40 keV, 1E13–5E14 $cm^{-2}$) is then implanted into the exposed PMOS region. The implanted B or $BF_2$ forms $p^-$ low density (LD) regions 29 (low density P-type impurity regions) on each side of the PMOS gate structure 24b and with a portion thereof formed under the first sidewalls 25 of the PMOS gate structure 24b.

Figure 2D:
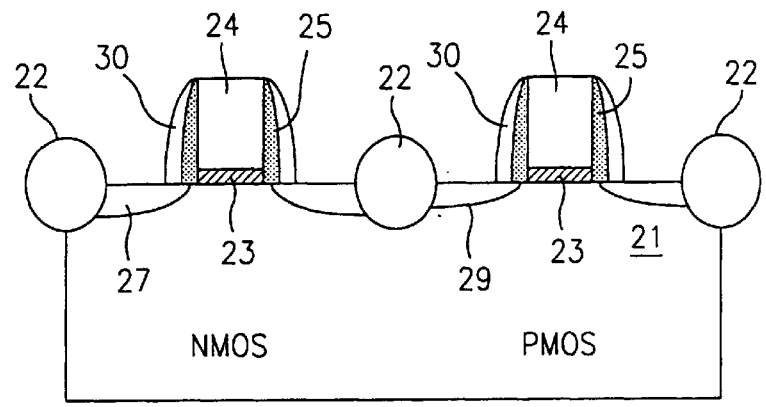

Referring to FIG. 2D, the second photoresist film 28 is removed, and a nitride film having a thickness, preferably, of about 500 Å to 1000 Å is then deposited over the semiconductor substrate 21. The deposited nitride film is then selectively etched to form second sidewalls 30 on the sides of the first sidewalls 25 of the NMOS gate structure 24a and the PMOS gate structure 24b.

Figure 2E:
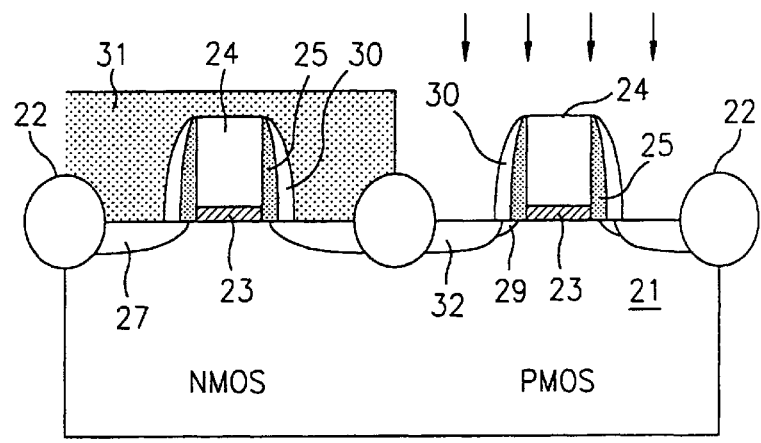

As shown in FIG. 2E, a third photoresist film 31 is formed over the NMOS region. As a result, the PMOS gate structure 24b with the second sidewalls 30 and the upper surface of the PMOS region on each side of the second sidewalls 30 of the PMOS gate structure 24b are exposed. Also exposed is a portion of the p LD regions 29. Preferably, ionized B (10–20 keV, 1E15–5E15 $cm^{-2}$) or $BF_2$ (20–40 keV, 1E15–5E15 $cm^{-2}$) is then implanted into the exposed $p^-$ LD regions 29. The implanted B or $BF_2$ forms $p^+$ source and drain (S/D) regions 32 (high density P-type source and drain impurity regions) form a portion of the $p^-$ S/D regions 29 on each side of the PMOS gate structure 24b with a portion thereof formed under the second sidewalls 30. Also, a portion of the $p^-$ LD regions 29 remains adjacent to each of the $p^+$ S/D regions 32 formed under the PMOS gate structure 24b.

Figure 2F:
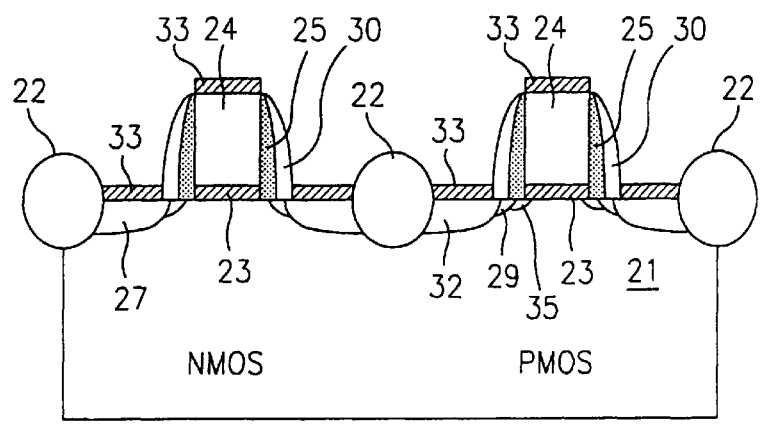

Referring to FIG. 2F, a metal layer including, e.g., Ti or Co, is deposited over the semiconductor substrate 21. Subsequently, a rapid thermal annealing RTA process is performed on the semiconductor device. The RTA process is performed, preferably, at temperatures ranging from about 950° C. to 1050° C. The RTA process causes phosphor P in the first sidewalls 25, which include a phosphorous silicate glass PSG, of the NMOS gate structure 24a and the PMOS gate structure 24b to diffuse into the semiconductor substrate 21.

The diffused P forms n⁻ low density (LD) regions 34 (low density N-type impurity regions) in the NMOS region and n⁻ halo impurity regions 35 (high density N-type halo impurity regions) in the PMOS region. The n⁻ LD regions 34 are formed adjacent to each of the n⁺ S/D regions 27 and under the NMOS gate structure 24a. The n⁺ halo impurity regions 35 are formed adjacent to each of the p⁻ LD regions 29 under the PMOS gate structure 24b. The RTA process also causes the deposited metal layer to form a silicide film 33 on the NMOS gate structure 24a, the PMOS gate structure 24b, the n⁻ S/D regions 27, and the p⁺ S/D regions 32.

As a result of the above fabricating method according to the first embodiment of the present invention, a channel length for the NMOS device is less than the channel length for the PMOS device. That is, the channel length between the n⁻ LD regions 34 of the NMOS device is less than the channel length between the n⁺ halo impurity regions 35, of the PMOS device. In addition, the p⁺ S/D regions 32 of the PMOS device are not formed deeper than the n⁻ S/D regions 27 of the NMOS device.

Referring to FIGS. 3A–3F, a method of fabricating a semiconductor device according to a second embodiment of the present invention will be described.

Figure 3A:
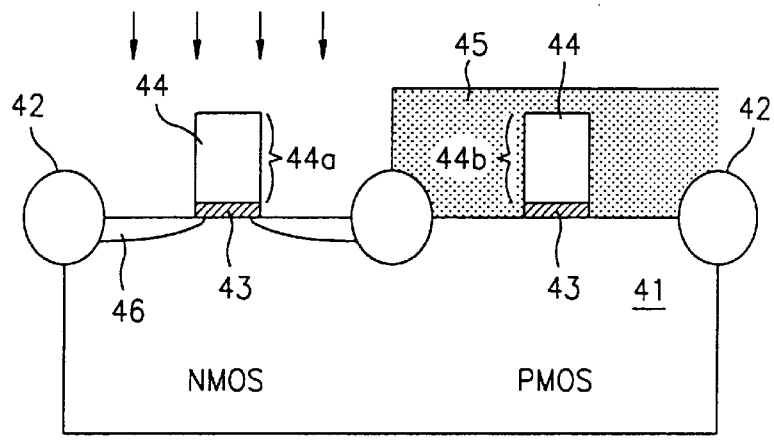
FIGS. 3A–3F are cross-sectional views illustrating the method of fabricating the semiconductor device according to a second embodiment of the present invention.

As shown in FIG. 3A, a semiconductor substrate 41 having an NMOS region and a PMOS region is provided. Also provided is a field region 42 formed between the NMOS region and the PMOS region. The field region 42 separates and distinguishes the NMOS region from the PMOS region.

An NMOS device and a PMOS device are then formed on portions of the NMOS region and the PMOS region, respectively. The NMOS device includes an NMOS gate structure 44a and the PMOS device includes a PMOS gate structure 44b. The NMOS and PMOS gate structures 44a and 44b are formed by forming a gate insulating film 43, which is an oxide film, on portion of the NMOS and PMOS regions, respectively. A polysilicon layer is then deposited over the semiconductor substrate 41, and selectively removed using a photolithographic process to form a gate electrode layer 44 on the gate insulating film 43.

A first photoresist film 45 is then formed over the PMOS region of the semiconductor substrate 41. As a result, the NMOS gate structure 44a and the upper surface of the NMOS region on each side of the NMOS gate structure 44a are exposed. Preferably, ionized As (10–40 keV, 5E13–5E14 cm⁻²) or P (20–40 keV, 5E13–5E14 cm⁻²) is implanted into the exposed NMOS region. The implanted ionized As or P forms n⁻ low density (LD) regions 46 (low density N-type impurity regions) on each side of the NMOS gate structure 44a and with a portion thereof formed under the NMOS gate structure 44a.

Figure 3B:
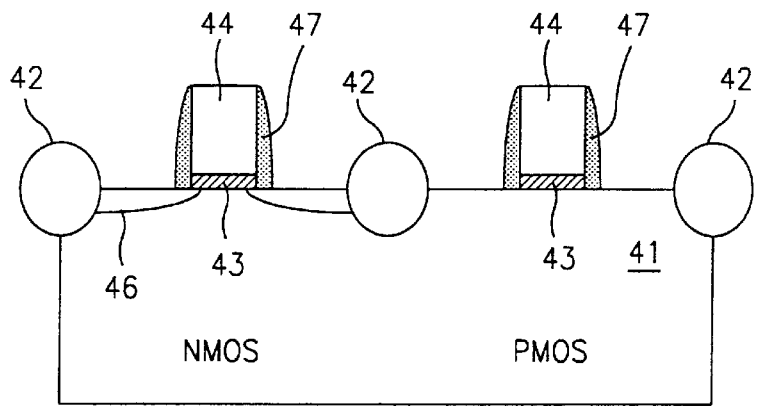

Referring to FIG. 3B, the first photoresist film 45 is removed, and a boron silicate glass BSC film is deposited over semiconductor substrate 41 to a thickness, preferably, ranging from 300 Å to 700 Å. The deposited BSG film is then selectively etched to form first sidewalls 47 on each side of the NMOS and PMOS gate structures 44a and 44b, respectively.

Figure 3C:
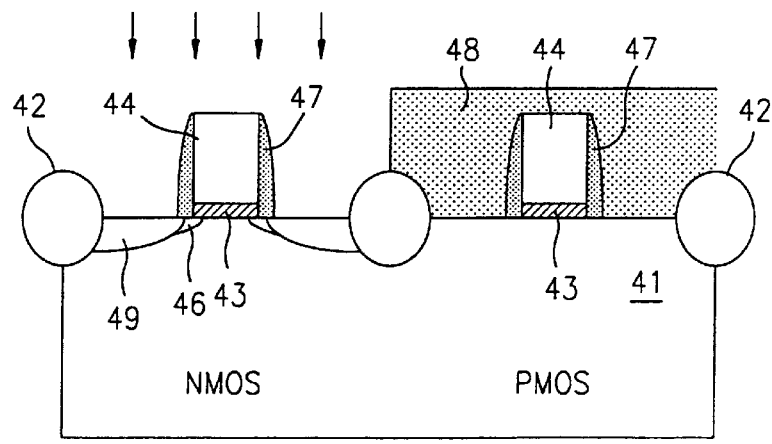

Referring to FIG. 3C, a second photoresist film 48 is formed over the PMOS region. As a result, the NMOS gate structure 44a with first sidewalls 47 and the upper surface of the NMOS region on each side of the first sidewalls 47 of the NMOS gate structure 44a are exposed including a portion of the n⁻ LD regions 46. Preferably, ionized As (10–50 keV, 1E15–5E15 cm⁻²) is implanted into the exposed n⁻ LD regions 46 on each side of the first sidewalls 47 of the NMOS gate structure 44a. The implanted As forms n⁺ source and drain (S/D) regions 49 (high density N-type source and drain impurity regions) from a portion of the n⁻ LD regions 46 on each side of the NMOS gate structure 44a with a portion thereof formed under the first sidewalls 47. Also, a portion of the n⁻ LD regions 46 remains adjacent to each of the n⁺ S/D regions 49 formed under the NMOS gate structure 44a.

Figure 3D:
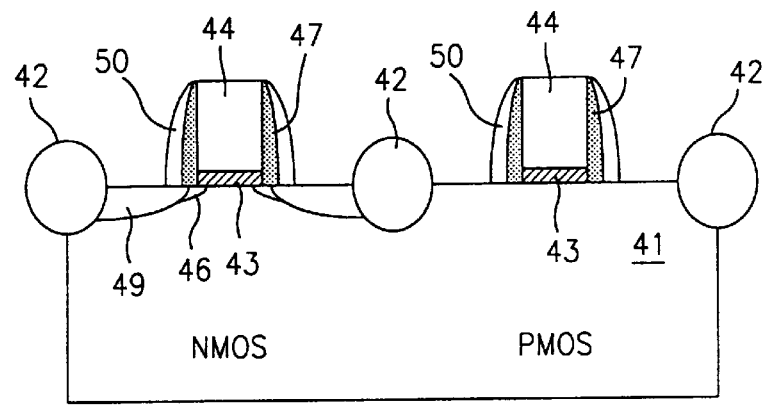

Referring to FIG. 3D, the second photoresist film 48 is removed, and a nitride film is deposited over the semiconductor substrate 41 to a thickness, preferably, ranging from 500 Å to 1000 Å. The deposited nitride film is then selectively etched to form second sidewalls 50 on the sides of the first sidewalls 47 of the NMOS gate structure 44a and the PMOS gate structure 44b.

Figure 3E:
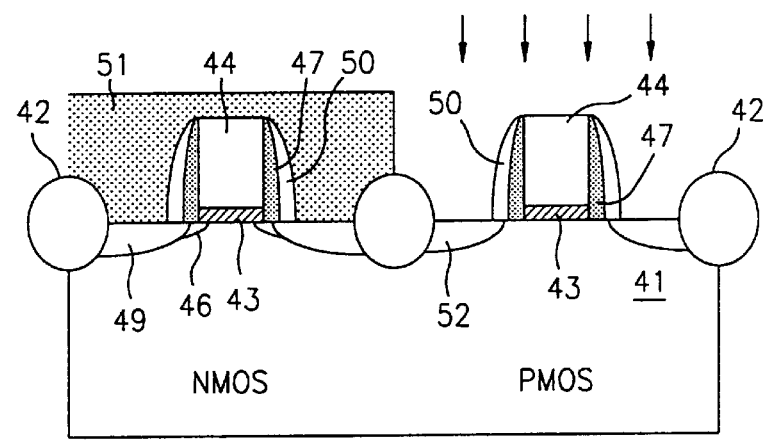

As shown in FIG. 3E, a third photoresist film 51 is formed over the NMOS region. As a result, the PMOS gate structure 44b with the first and second sidewalls 47 and 50, respectively, and the upper surface of the PMOS region on each side of the second sidewalls 50 are exposed. Preferably, ionized boron B (10–20 keV, 1E15–3E15 cm⁻²) or boron fluoride BF₂ (20–40 keV, 1E15–5E15 cm⁻²) is implanted into the exposed PMOS region. The implanted ionized B or BF₂ forms p⁻ source and drain (S/D) regions 52 (high density P-type source and drain impurity regions) on each side of the PMOS gate structure 44b and with a portion thereof formed under the second sidewalls 50 of the PMOS gate structure 44b.

Figure 3F:
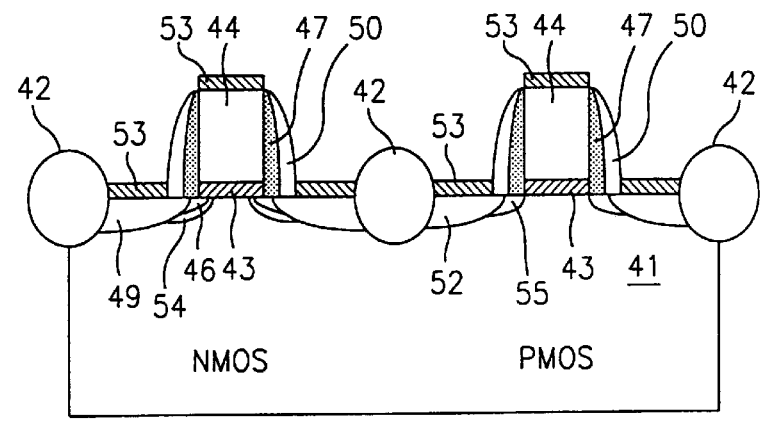

Referring to FIG. 3F, a metal layer including, e.g., Ti or Co, is deposited over the semiconductor substrate 41. Subsequently, a rapid thermal annealing RTA process is performed on the semiconductor device. The RTA is performed, preferably, at temperatures ranging from about 950° C. to 1050° C. The RTA process causes the boron B in the first sidewalls 47, which include a boron silicate glass BSG, of the NMOS gate structure 44a and the PMOS gate structure 44b to diffuse into the semiconductor substrate 41.

The diffused B forms p⁻ halo impurity regions 54 (low density P-type halo impurity regions) in the NMOS region and p⁻ low density (LD) regions 55 (low density P-type impurity regions) in the PMOS region. The p⁻ halo impurity regions 54 are formed adjacent to each of the n⁻ LD regions 46 formed under the NMOS gate structure 44a. The p⁻ LD regions 55 are formed adjacent to each of the p⁺ S/D regions 52 with a portion thereof formed under the first sidewalls 47 of the PMOS gate structure 44b. The RTA process also causes the deposited metal layer to form a silicide film 53 on the NMOS gate structure 44a, the PMOS gate structure 44b, the n⁺ S/D regions 49, and the p⁻ S/D regions 52.

As a result of the above fabricating according to the second embodiment, a channel length for the NMOS device is less than the channel length for the PMOS device. That is, the channel length between the p⁻ halo impurity regions 54 of the NMOS device is less than the channel length between the p⁻ LD regions 55 of the PMOS device. Also, the p⁺ S/D regions 52 of the PMOS device are not formed deeper than the n⁺ S/D regions 49 of the NMOS device.

As described above, the fabrication method according to the preferred embodiments of the present invention improve the operating performance of a CMOS device.

Specifically, the preferred embodiments improve current driving capability for an NMOS device. The current driving capability for the NMOS device is improved by decreasing a channel length for the NMOS device. Also, the preferred embodiments of the present invention prevent short channel effects for a PMOS device from deteriorating by preventing the source and drain regions of the PMOS device from deepening.

Further, because low and high density impurity regions and halo impurity regions can be formed by diffusing a P-type impurity or an N-type impurity, e.g., phosphor P or boron B, from the first sidewalls of the NMOS or PMOS gate structures into the semiconductor substrate using a RTA process, an extra ion-implanting process is avoided.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:
   a substrate having a first region and a second region;
   a first gate structure and a second gate structure formed on the first region and the second region, respectively;
   first impurity regions formed in the first region on each side of the first gate structure;
   second impurity regions formed in the first region adjacent to each of the first impurity regions;
   third impurity regions formed in the second region on each side of the second gate structure;
   fourth impurity regions formed adjacent to each of the third impurity regions;
   halo impurity regions formed adjacent to each of the one of the second impurity regions and the fourth impurity regions, and the halo impurity regions being of an impurity type opposite an impurity type of the one of the second impurity regions and the fourth impurity regions to which the halo impurity regions are formed adjacent.

2. The semiconductor device of claim 1, wherein the first region is a NMOS region and the second region is a PMOS region.

3. The semiconductor device of claim 1, wherein the first and second gate structures include:
   gate insulating film formed on a portion of the NMOS region and a portion of the PMOS region, respectively;
   gate electrodes formed on the gate insulating film;
   first sidewalls formed on each side of the gate electrodes; and
   second sidewalls formed on sides of the first sidewalls.

4. The semiconductor device of claim 3, wherein the gate insulating film is formed from an oxide film.

5. The semiconductor device of claim 3, wherein the gate electrodes are formed from polysilicon.

6. The semiconductor device of claim 3, wherein the second sidewalls are formed from nitride.

7. The semiconductor device of claim 3, wherein the first sidewalls are formed from one of phosphorous silicate glass PSG and boron silicate glass BSG.

8. The semiconductor device of claim 1, wherein the first sidewalls include one of an N-type impurity and a P-type impurity.

9. The semiconductor device of claim 8, wherein the first sidewalls include the N-type impurity.

10. The semiconductor device of claim 9, wherein the halo impurity regions are formed adjacent to each of the fourth impurity regions.

11. The semiconductor device of claim 10, wherein the second impurity regions and the halo impurity regions include the N-type impurity.

12. The semiconductor device of claim 11, wherein the second and halo impurity regions are low density and high density N-type impurity regions, respectively.

13. The semiconductor device of claim 11, wherein the first impurity regions include an N-type impurity and the third and fourth impurity regions include a P-type impurity.

14. The semiconductor device of claim 13, wherein the first impurity regions are high density N-type impurity regions and the third and fourth impurity regions are high and low density P-type impurity regions, respectively.

15. The semiconductor device of claim 7, wherein the first sidewalls include a P-type impurity.

16. The semiconductor device of claim 15, wherein the halo impurity regions are formed adjacent to each of the second impurity regions.

17. The semiconductor device of claim 16, wherein the fourth impurity regions and the halo impurity regions include the P-type impurity.

18. The semiconductor device of claim 17, wherein the first and second impurity regions include an N-type impurity and the third impurity regions include a P-type impurity.

19. The semiconductor device of claim 18, wherein the fourth and halo impurity regions are low density P-type impurity regions, respectively.

20. The semiconductor device of claim 19, wherein the first and second impurity regions are high and low density N-type impurity regions, respectively, and the third impurity regions are high density P-type impurity regions.

* * * * *